United States Patent [19]
Denker et al.

[11] Patent Number: 5,559,463
[45] Date of Patent: Sep. 24, 1996

[54] LOW POWER CLOCK CIRCUIT

[75] Inventors: John S. Denker, Leonardo; Alexander G. Dickinson, Neptune, both of N.J.; Alan H. Kramer, Berkeley, Calif.; Thomas R. Wik, Hanover Township, Pa.

[73] Assignee: Lucent Technologies Inc., Murray Hill, N.J.

[21] Appl. No.: 229,258

[22] Filed: Apr. 18, 1994

[51] Int. Cl.$^6$ ............................... H03K 5/12; H03K 5/18
[52] U.S. Cl. .......................... 327/300; 327/177; 327/181; 327/304; 331/113 R
[58] Field of Search ........................ 327/108–112, 154, 327/165, 171, 172, 177, 181, 291, 300, 304; 331/113 R, 114, 117 R, 117 FE, 117 D, 144, 151

[56] References Cited

U.S. PATENT DOCUMENTS

| | | | |
|---|---|---|---|
| 3,239,772 | 3/1966 | Dennis, Jr. | 327/108 |
| 5,068,571 | 11/1991 | Schoofs | 331/113 A |
| 5,107,136 | 4/1992 | Stekelenburg | 327/112 |
| 5,126,589 | 6/1992 | Renger | 327/111 |
| 5,396,195 | 3/1995 | Gabara | 331/113 R |
| 5,408,150 | 4/1995 | Wilcox | 327/108 |

OTHER PUBLICATIONS

"An Overview of Soft–Switching Techniques for PWM Converters", CIEP '92 Mexico, ED&PE '92, Czechoslovakia, Guichao Hua and Fred C. Lee, 10 pages.

"Merits and Limitations of Resonant and Soft–Switched Converters", IEEE Aug., 1992, Milan M. Jovanovic, pp. 51 through 58.

*Primary Examiner*—Timothy P. Callahan
*Assistant Examiner*—T. Lam
*Attorney, Agent, or Firm*—Scott W. McLellan

[57] ABSTRACT

High-efficiency clock generator circuits having single or complementary outputs for driving capacitive loads. The clock generator has therein at least one pair of complementary FET switches, coupled between the output of the generator and power supply rails, and an inductor. The generator is operated at a frequency approximately equal the resonant frequency of the inductor combined with the capacitance of the load. Energy normally stored in the load and dissipated in the FETs as in conventional clock generators is instead stored in the inductor and returned to the loads for reuse.

5 Claims, 3 Drawing Sheets

LOW POWER CLOCK CIRCUIT

BACKGROUND OF THE INVENTION

CROSS-REFERENCE TO RELATED APPLICATION

This application is related to a co-pending patent application titled "Low-Power-Dissipation CMOS Oscillator Circuits", by T. J. Gabara, Ser. No. 08/165433, filed Dec. 13, 1994 and assigned to the same assignee as this application.

1. Field of the Invention

This invention relates to logic circuits generally and, more particularly, to clock generator circuits for driving logic gates disposed on a chip or any other capacitive load, such as liquid crystal displays or the like.

2. Description of the Prior Art

Microprocessors, digital signal processors (DSPs) and other synchronous digital logic circuits rely on a clock to maintain synchronization and control over operations therein. One limitation to the processing power of a processor embodied on a integrated circuit chip is the amount of power the processor can dissipate. The power limitations is established by the power the chip's packaging can dissipate based in part on the maximum temperature the chip can tolerate.

Similarly, in portable applications, battery capacity can limit the amount of power a chip can consume.

Most single chip processors are fabricated with complementary metal-oxide-semiconductor (CMOS) technology. CMOS is very power efficient. The amount of power a CMOS chip dissipates is approximately proportional to the product of the frequency or speed of the clock, the number of logic gates capacitively loading clock distribution network wiring on the chip and the square of the power supply voltage. It has been found that either the clock frequency must be limited to less than the maximum possible or the number of gates reduced on the chip to meet the power dissipation limitation in some instances. Alternatively, the power supply voltage may be reduced from a nominal five volts to 3.3 volts or less.

The most prevalent methods of reducing the power dissipation/consumption are to reduce the clock frequency or reduce the supply voltage. Obviously, these may not be practical or desirable in all circumstances. Thus, another approach is needed to reduce power consumption.

SUMMARY OF THE INVENTION

A major contributor to power dissipation on a chip such as a microprocessor is the clock generator circuit. It is, therefore, desirable to reduce the power dissipation in the clock generator without reducing the clock frequency or the power supply voltage.

These and other aspects of the invention are obtained generally in one exemplary embodiment of the invention as a clock generator having an output, for generating a clock signal to a lead having a capacitance. The generator is characterized by a storage capacitor, an inductor coupled between the generator output and the storage capacitor, a first switch between the generator output and a first power supply rail, and a second switch between the generator output and a second power supply rail.

Alternatively, the above aspects of the invention are obtained generally in another exemplary embodiment of the invention as a clock generator having first and second outputs, for generating complementary clock signals to loads coupling to the outputs, the loads having capacitance. The generator is characterized by: an inductor coupled between both generator outputs, a first switch between the first output and a first power supply rail, a second switch between the first output and a second power supply rail, a third switch between the second output and the first power supply rail, and a fourth switch between the second output and the second power supply rail.

BRIEF DESCRIPTION OF THE DRAWING

The foregoing features of this invention, as well as the invention itself, may be more fully understood from the following detailed description of the drawings, in which.

DETAILED DESCRIPTION

Figure 1:
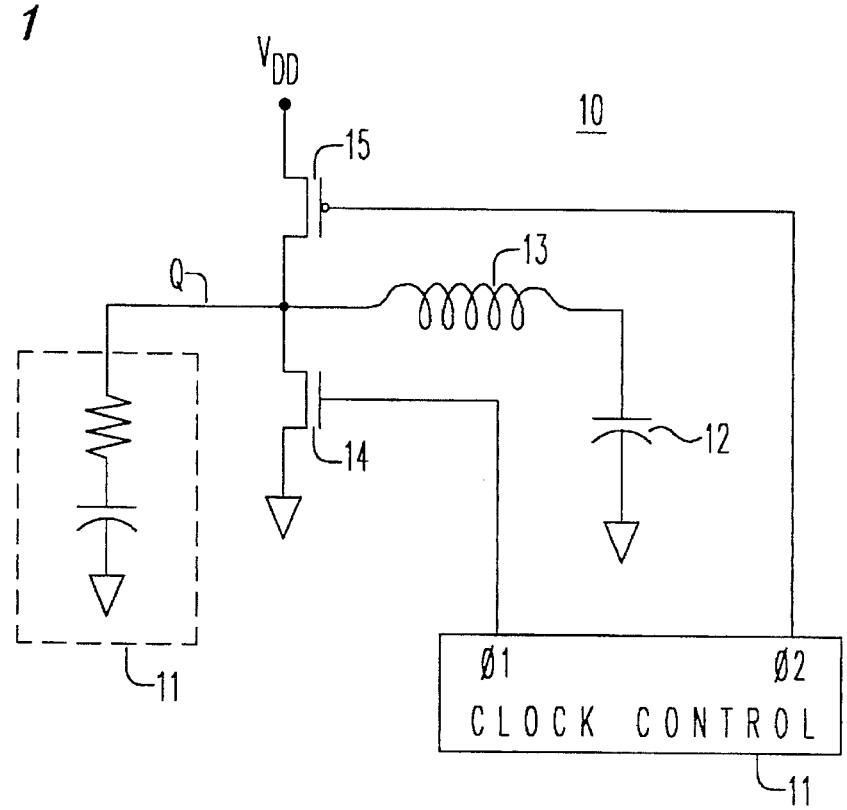
FIG. 1 is a simplified schematic diagram of a single output clock generator circuit according to one embodiment of the invention.

In FIG. 1, an exemplary embodiment of the invention is shown. A clock generator 10 has an output Q, for generating a clock signal to a load 11. The load 11 is shown here as being a capacitor in series with a resistor, as will be discussed in more detail below. The generator 10 includes a storage capacitor 12 in series with an inductor 13 coupled to the generator output. First and second switchs 14, 15 (shown here as n-channel and p-channel transistors, respectively) supply energy to the load 11 by coupling the generator output Q alternately between two power supply rails, Vdd and ground. A clock controller 16 controls the operation of the first and second switches 14, 15 to desirably avoid the simultaneous conduction of the switches 14, 15 in addition to controlling the frequency and the length of time the switches are closed, as will be discussed below in more detail. This approach to reusing energy stored in the load 11 (energy flows between the capacitance in the load 11 and the inductor 13) in each clock cycle reduces the power consumption in the generator 10. This is sometimes referred to as an adiabatic process, a process in which the state of the system changes without adding or subtracting a substantial amount of energy therefrom.

Figure 2:
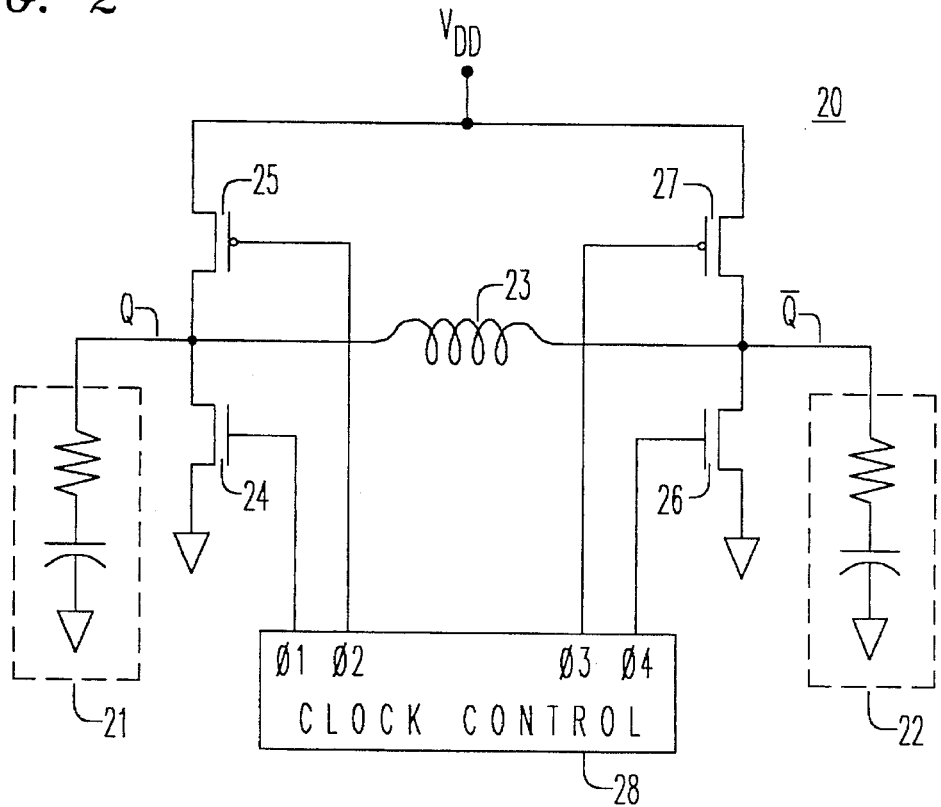
FIG. 2 is a simplified schematic diagram of a complementary output clock generator circuit according to another embodiment of the invention.

Alternatively, an exemplary embodiment true and complementary output clock generator is shown in FIG. 2. A clock generator 20 has first and second outputs Q, $\overline{Q}$ having thereon complementary clock signals. The outputs Q, $\overline{Q}$ are coupled to loads 21, 22 that are similar to the load 11 in FIG. 1. The generator includes an inductor 23 coupled between both generator outputs, a first switch 24 connected between the Q output and a first power supply rail (ground), a second switch 25 connected between the Q output and a second power supply rail (Vdd), a third switch 26 connected between the $\overline{Q}$ output and the first power supply rail (ground), and a fourth switch 27 between the $\overline{Q}$ output and the second power supply rail (Vdd). The first through fourth transistors 24–27 (shown here as n-channel, p-channel, n-channel and p-channel field-effect transistors or FETs, respectively) supply energy to the loads 21, 22. Similar to that shown in FIG. 1, clock controller 28 controls the operation of the switches 24–27.

As stated above, the load 11 (FIG. 1) is shown as a series combination of a resistance and a capacitance. This is a good approximation of the clock distribution network on a chip, such as in a CMOS microprocessor. The capacitance represents the distributed load and stray (parasitic) capacitance along a clock distribution network while the resistance represents the parasitic resistance in the clock distribution network where some power is lost (e.g., dissipated) as the clock network is driven by the clock generator. The majority of the power dissipation in prior art clock generators occurs within the generator itself during the charging and discharging of the clock network capacitance.

In more detail, the clock generator 10 in FIG. 1 has the storage capacitor 12 in series with the inductor 13 and the capacitance in load 11. The capacitance of the storage capacitor 12 may be much greater than the capacitance of the load 11 (e.g., ten times as much) so that the resonant frequency of the storage capacitor 12/inductor 13/load 11 combination (referred to herein simply as the resonant frequency) is substantially determined by the combination of the inductor 13 and the capacitance in the load 11. Transistors 14 and 15 are arranged as pull-down and pull-up switches, respectively, and may include integral diodes to clamp the output voltage excursions to within a diode forward voltage of the power supply rails. To reduce power dissipation within the clock circuit, it is desirable that the two transistors 14, 15 do not simultaneously conduct to avoid forming a low resistance path between the two supply rails, Vdd and ground. Further, it is desirable that the operating frequency of the clock generator should be approximately equal to the resonant frequency of the inductor 13 and load 11 combination.

To operate the generator 10, clock control 16 provides two clock drive signal phases, $\Phi_1$, $\Phi_2$, to the gates of transistors 14, 15, the timing thereof being preferably arranged such that the both transistors 14, 15 are turned off during clock signal transitions on the clock generator output Q and at no time are both transistors 14, 15 simultaneously conducting. Charge is supplied to or removed from the capacitors in the load 11 by the current in the inductor 13. Thus, energy is exchanged between the magnetic field of the inductor and the electric field of the capacitors during the output transitions rather than extracting this energy from the power supply during this interval.

Timing of the clock drive signals should be arranged to have the transistors switches 14, 15 close when the voltage across them is close to zero, commonly referred to as zero voltage switching. This serves to reduce the power dissipation in the transistor switches. Energy is extracted from the power supply to make up for dissipation in the parasitic resistances during the time interval that the transistor switches are turned on (the switches are closed). This addition of energy to the overall system occurs with desirable high efficiency. Such would not be the case if the switches were closed during the output transitions.

The timing and frequency of the clock signals $\Phi_1$, $\Phi_2$ will be discussed in more detail in connection with FIG. 5. However, it is understood that it is not essential that the transistors not be simultaneously conductive or that the transistors be switched at a rate approximately equal to the resonant frequency, as will be discussed below. Specific applications may require compromising some or all of the above conditions, however, the efficiency of the clock generator will be improved as these operating conditions are approached.

Figure 5:
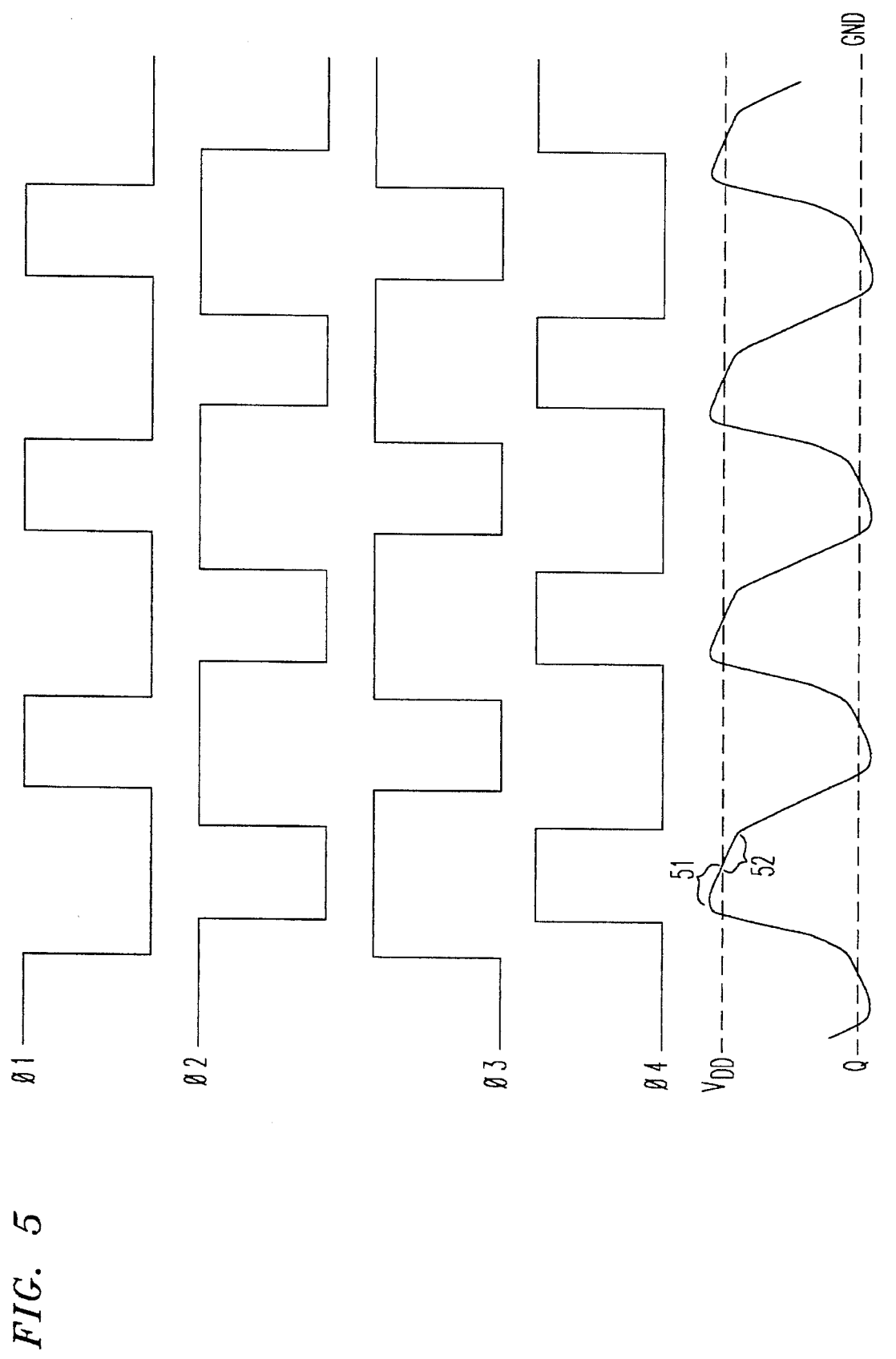
FIG. 5 is an exemplary plot (not to scale) of certain signals common to the clock generator of FIGS. 1, 2 and 3.

Operation of the clock generator 10 may be understood by turning temporarily to FIG. 5 and referring to waveforms $\Phi_1$, $\Phi_2$ and Q (not to scale). As shown in FIG. 1, the clock control 11 has two outputs $\Phi_1$, $\Phi_2$ coupled to corresponding transistors 14, 15. In FIG. 5, the waveforms from the clock generator 10 are shown with the more positive the waveform (representing voltage), the higher the waveform. Thus, for $\Phi_1$, during the positive peaks of the waveform transistor 14 is conducting, being an n-channel transistor. Conversely, because transistor 15 is a p-channel transistor, during the negative peaks of the $\Phi_2$ waveform transistor 15 is conducting. As shown, the waveforms are arranged such that both transistor 14, 15 are not conducting simultaneously, i.e., the transistors are being oppositely clocked and may have a substantial portion of a clock cycle where neither transistor conducts. The resulting waveform is shown as Q. It is understood that the waveforms $\Phi_1$–$\Phi_2$ need not be square waves but may be other waveforms such as ramps or sine waves.

In practice, energy flows repeatedly between the capacitance in the load 11, the inductor 13 and capacitor 12 (the capacitance of capacitor 12 being large enough that the voltage thereon makes small excursions about Vdd/2). Energy lost due to losses in the load 11 (represented by the resistor) and in other components such as the inductor are replenished by the transistors 14, 15 coupling the power supply rails to the load 11/inductor 13 resonant system combination. Specifically, the output Q is periodically coupled to one supply rail (Vdd or ground) and the output is held at or near that voltage while the corresponding transistor 14, 15 is conducting. For example, the output Q is held at or near Vdd for the amount of time the transistor 15 is conducting. Alternately, the output Q is held at or near ground for the amount of time the transistor 14 is conducting. Simultaneously, because the inductor 13 is coupled to one of the power supply rails and the storage capacitor 12 (which has a nominal voltage thereon of Vdd/2), it returns power to, and receives energy from, the power supply or from the storage capacitor 12 depending on the length of time respective transistor 14 or transistor 15 is conducting, as will be discussed in more detail below in connection with FIG. 5.

It is desirable but not essential that the frequency of $\Phi_1$ and $\Phi_2$ be substantially equal to the resonant frequency to achieve high efficiency. Operating the clock generator in a hyper-resonant mode (the resonant frequency is higher than the clock frequency) has the advantage of fast rise and fall times in the clock waveform while still preserving high efficiency.

An alternative embodiment of a clock generator is shown in FIG. 2 having true and complementary (Q and $\overline{Q}$, respectively) outputs. Like the clock generator 10 in FIG. 1, there is a lead 21 coupled to the Q output of the generator 20 and an inductor 23 coupled to the Q output. Also like generator 10, two transistors 24, 25 are arranged as pull-down and pull-up switches, respectively, and include integral diodes to clamp the output voltage excursions to within a forward-biased diode voltage drop of the power supply rails. Added are two additional transistors 26, 27 as pull-down and pull-up switches, respectively, to the $\overline{Q}$ output and include integral diodes as well. Inductor 23 also couples to the $\overline{Q}$ output instead of to a storage capacitor, thus being disposed between the Q and $\overline{Q}$ outputs. The resonant frequency is substantially determined by the inductor 23 in combination with the capacitance of the two loads 21, 22 in series. Because there are four switches, clock control 28 provides four clock drive signal phases, $\Phi_1$–$\Phi_4$, to the gates of transistors 24–27, respectively, which avoids simultaneously having transistors 24 and 25 conducting or having transistors 26 and 27 simultaneously conducting. Thus, transistor 24 is clocked oppositely to transistor 25 and transistor 26 is clocked oppositely to transistor 27 and the amount of time neither transistor is conducting may be a considerable portion of the clock cycle. Further, the clock control 28 switches the transistors at a rate approximately equal to the resonant frequency of the inductor 23 and loads 21, 22 combination. This will be discussed in more detail in connection with FIG. 5. However, it is understood that it is not essential that the transistors not be simultaneously conductive, that the transistors be switched at a rate approximately equal to the resonant frequency, that the amount of time each transistor conducts be the same in a clock cycle, or that the conduction time of a transistor be the same in each clock cycle. Further, it is desirable but not essential that the loads 21, 22 be substantially equal so that the signals on the Q and $\overline{Q}$ outputs are substantially the same but complementary.

Referring again to FIG. 5, the exemplary waveforms labeled $\Phi_1$–$\Phi_4$ correspond to the drive signals generated by the clock control 28. Drive signals $\Phi_1$ and $\Phi_2$ are similar to that shown in FIG. 1 and operate transistors 24, 25 the same as transistors 14, 15 in FIG. 1. It is desirable, but not essential, in this embodiment that drive signals $\Phi_3$ and $\Phi_4$ are the complement of signals $\Phi_1$ and $\Phi_2$, respectively. Thus, in this embodiment, transistors 25 and 26 conduct at approximately the same time and transistors 24 and 27 conduct at the same time but it is not essential that this occur, i.e., an asymmetric operation is possible. Transistors 24 and 25 do not simultaneously conduct, as stated above, nor do transistors 26 and 27 simultaneously conduct.

Operation of the clock generator 20 is similar to the operation of the clock generator 10 of FIG. 1 except that storage capacitor 12 is replaced with load 22. Energy flows repeatedly between the capacitance in the loads 21, 22 and the inductor 23. Energy lost due to losses in the loads 21, 22 and other components such as the inductor 23 are replenished by the transistors 24–27 coupling the power supply rails to the load 21/load 22/inductor 23 resonant system combination. Specifically, the outputs Q, $\overline{Q}$ are periodically coupled to opposite supply rails (Vdd, ground) and are held at or near that voltage while the two of the transistors 24–27 are conducting. For example, output Q is held at or near Vdd for the amount of time the transistor 25 is conducting and the output $\overline{Q}$ is held at or near ground for the amount of time the transistor 26 is conducting. Alternately, the output Q is held at or near ground for the amount of time the transistor 24 is conducting and the output $\overline{Q}$ is held at or near Vdd for the amount of time the transistor 27 is conducting. Simultaneously, because the inductor 23 is coupled between the power supply rails during the intervals that two of the four transistors 24–27 are conducting, it receives or sources energy from/to the power supply. However, it is sufficient for the inductor 23 to receive energy from the Vdd power supply rail if either transistor 25, 27 is conducting.

As stated above, it is desirable but not essential that the frequency of $\Phi_1$–$\Phi_4$ be substantially equal to the resonant frequency to achieve high efficiency and may be operated in a hyper-resonant or hypo-resonant mode. It is understood that as the rise and fall times of the clock waveform are slowed, the power dissipated in the loads 21, 22 is correspondingly reduced.

Figure 3:
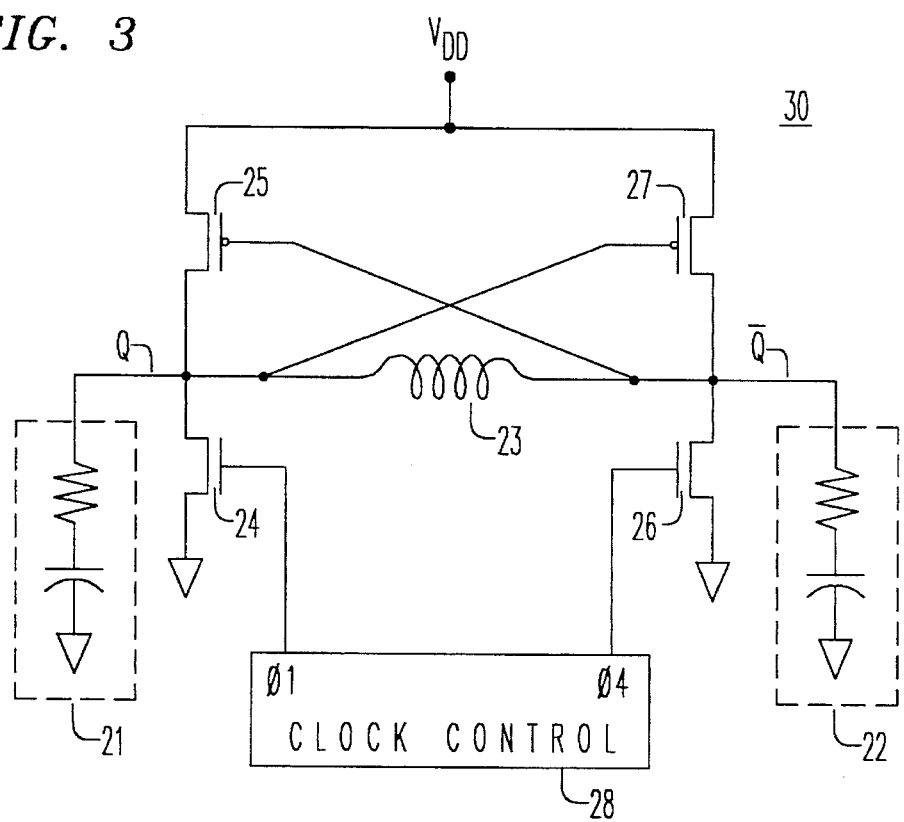
FIG. 3 is a simplified schematic diagram of complementary output clock generator circuit with simplified control signals according to another embodiment of the invention.

Another exemplary embodiment of the invention similar to that shown in FIG. 2 is shown in FIG. 3. Here, the drive signals $\Phi_2$, $\Phi_3$ are not needed for the clock generator 30 because the gates to transistors 25 and 27 are driven by the signals on the outputs $\overline{Q}$, Q, respectively. The waveforms of the drive signals $\Phi_1$ and $\Phi_4$ are the same as that shown in FIG. 5.

Figure 4:
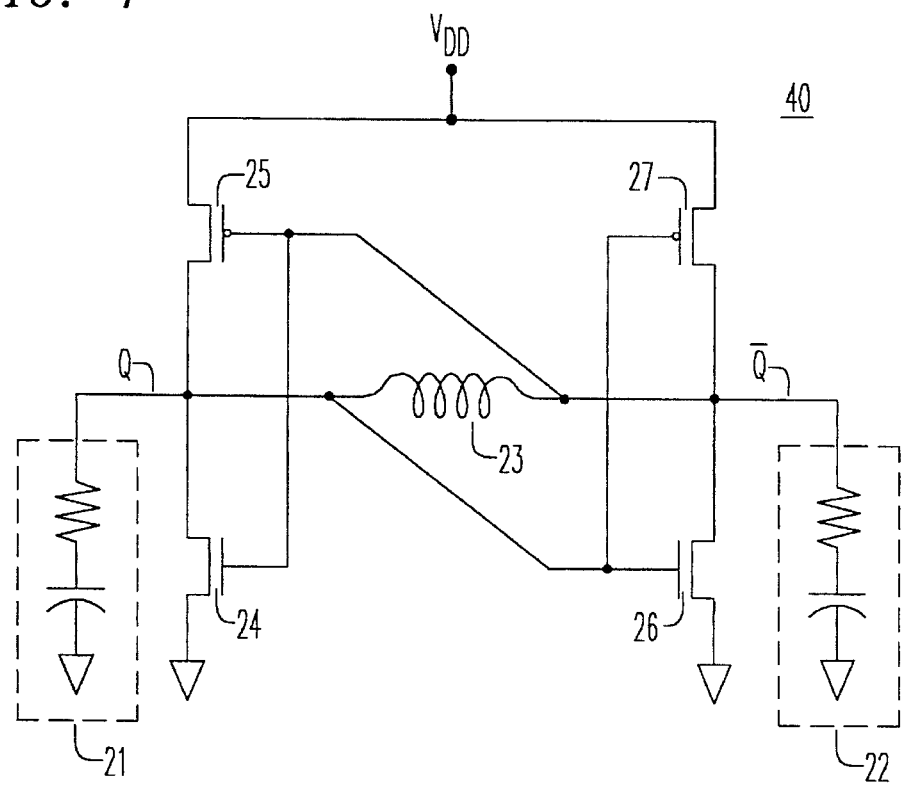
FIG. 4 is a simplified schematic diagram of a self-oscillating complementary output clock generator circuit according to another embodiment of the invention.

Still another exemplary embodiment of the invention similar to that shown in FIGS. 2 and 3 is shown in FIG. 4. Here, no clock control is provided as the clock generator 40 is self oscillating and operating at a frequency substantially determined by the resonant combination of the inductor 23 and the loads 21, 22.

Operation of the clock generators 10, 20 (FIGS. 1–4), as exemplified by the waveforms in FIG. 5, is in the hyper-resonant mode as discussed above. As shown in FIG. 5, sloping portions 51, 52 of the clock signal waveform Q transitions the power supply voltages, Vdd and ground. The sloping of the waveform generally results from the changing current in the inductors 13, 23 through the finite on-resistance of the switches 14, 15 (FIG. 1), 24–27 (FIGS. 2–4) while they are conducting. The sloping portion of the output waveform Q crosses Vdd or ground when the current in the inductor 12, 23 changes polarity. For example, for the waveform Q portions 51, energy is returned to the power supply rail Vdd from the inductor 13, 23. In contrast, for the portion 52, energy is absorbed by the inductor 13, 23 from the power supply rail Vdd. The net amount of energy absorbed by the inductor 13, 23 from the power supply overcomes the power dissipated by the generator 10, 20 and in the loads.

If the generator 10, 20 is to be operated with a substantially sinusoidal output, the generator operates with a clock frequency substantially equal to the resonant frequency. To further increase efficiency, the amount of time the switches 14, 15, 24–27 need to be closed may be reduced to just that sufficient to maintain the desired clock signal Q amplitude. The generator 10, 20 may also be operated in a hypo-resonant mode where the resonant frequency is lower than the clock frequency, although the efficiency of the generator may be reduced.

It is understood that it may be desirable to fabricate the inductor 13/23 and/or storage capacitor 12 either on-chip or external to the chip embodying the rest of the clock generator 10, 20. The inductor 13/23 may also be provided by package lead frame inductance wire bond inductance, etc. or combinations thereof. Reasons for choosing which approach for providing the inductor includes the physical size and value of the components being incompatible with chip manufacture. Further, testability of the logic circuitry driven by the generator 10, 20 may require the removal of the inductor to allow low frequency operation of the clock generator 10, 20.

It is further understood that operation of the clock generators 10, 20 need not be periodic, i.e., the operation of the switches (transistors) therein need not be substantially identical in each clock cycle. For example, all of the switches can remain open every other clock cycle with the possibility of extending the time the switches are closed. Further, the amount of time any given switch remains closed varies from clock cycle to clock cycle. In the case of generator 20 (FIG. 2), transistors 24 and 27 or transistors 25 and 26 may be eliminated or not used and still have a functional clock generator 20.

While MOSFETs have been disclosed in the above exemplary embodiments of the invention, FETs generally, bipolar transistors or other switching means could be used. In general, power dissipation in the clock generators may be reduced as the on-resistance and the gate capacitances of the switches are reduced.

Having described the preferred embodiment of this invention, it will now be apparent to one of skill in the art that other embodiments incorporating its concept may be used. Therefore, this invention should not be limited to the disclosed embodiment, but rather should be limited only by the spirit and scope of the appended claims.

We claim:

1. A clock generator having first and second outputs, for generating complementary clock signals to loads coupling to the outputs, the loads having capacitance, the generator being CHARACTERIZED BY:

an inductor coupled between both generator outputs;

a first switch between the first output and a first power supply rail;

a second switch between the first output and a second power supply rail;

a third switch between the second output and the first power supply rail; and a fourth switch between the second output and the second power supply rail;

wherein the first switch is operated oppositely to the second switch and the third switch is operated oppositely to the fourth switch in response to control signals coupled to the switches; and wherein the combination of inductor and load capacitance has a resonant frequency and the switches are switched at a frequency approximately equal to the resonant frequency.

2. The clock generator of claim 1, wherein the load capacitances are approximately equal.

3. The clock generator of claim 1, wherein the switches are FETs, the first and third switches being of a polarity opposite that of the second and fourth switches.

4. The clock generator of claim 3, wherein the switches are transistors, each having a control input, further characterized by control input of the first transistor being coupled to the second output and the control input of the third transistor being coupled to the first output.

5. The clock generator of claim 4, further characterized by the control input of the second transistor being coupled to tile second output and the control input of the fourth transistor being coupled to the first output.

* * * * *